(12) United States Patent
Tang et al.

(10) Patent No.: US 10,050,406 B2
(45) Date of Patent: Aug. 14, 2018

(54) EXTERNAL CAVITY TUNABLE LASER AND CAVITY MODE LOCKING METHOD THEREOF

(71) Applicant: Accelink Technologies Co., Ltd., Wuhan (CN)

(72) Inventors: Xuesheng Tang, Wuhan (CN); Yanfeng Fu, Wuhan (CN); Kun Qian, Wuhan (CN); Yong Luo, Wuhan (CN); Yizong Chen, Wuhan (CN); Di Zhang, Wuhan (CN); Qianggao Hu, Wuhan (CN); Yi Tang, Wuhan (CN); Chao Luo, Wuhan (CN)

(73) Assignee: Accelink Technologies Co., Ltd. (CN)

( * ) Notice: Subject to any disclaimer, the term of this patent is extended or adjusted under 35 U.S.C. 154(b) by 0 days.

(21) Appl. No.: 15/460,956

(22) Filed: Mar. 16, 2017

(65) Prior Publication Data

US 2017/0187163 A1 Jun. 29, 2017

Related U.S. Application Data

(63) Continuation of application No. PCT/CN2014/087485, filed on Sep. 26, 2014.

(30) Foreign Application Priority Data

Sep. 18, 2014 (CN) .......................... 2014 1 0476908

(51) Int. Cl.
*H01S 3/10* (2006.01)
*H01S 5/14* (2006.01)
(Continued)

(52) U.S. Cl.
CPC .......... *H01S 3/1305* (2013.01); *H01S 3/1067* (2013.01); *H01S 5/028* (2013.01);
(Continued)

(58) Field of Classification Search
CPC ...... H01S 3/1067; H01S 5/028; H01S 5/0612; H01S 5/065; H01S 5/0683
See application file for complete search history.

(56) References Cited

U.S. PATENT DOCUMENTS

2003/0012250 A1  1/2003  Shirasaki
2005/0053103 A1  3/2005  Lo et al.
(Continued)

FOREIGN PATENT DOCUMENTS

CN    1849733    10/2006
CN    1930748    3/2007
(Continued)

OTHER PUBLICATIONS

International Search Report for International Patent Application PCT/CN2014/087485 dated Jun. 15, 2015.
(Continued)

*Primary Examiner* — Tuan Nguyen
(74) *Attorney, Agent, or Firm* — Lerner, David, Littenberg, Krumholz & Mentlik, LLP

(57) ABSTRACT

The present invention relates to an external cavity tunable laser and a cavity mode locking method thereof. In an embodiment, an external cavity tunable laser comprises a semiconductor amplifier having a partial reflective film provided on one end and an anti-reflective film provided on the other end, a cavity mirror provided at the anti-reflective end to define an external cavity therebetween, a large-range phasing assembly and a quick phasing assembly provided to adjust the optical length of the external cavity independently, an optical power detector provided to detect the optical power of the light output from the semiconductor amplifier, and a control unit in communication with the optical power detector, the large-range phasing assembly, and the quick phasing assembly.

18 Claims, 5 Drawing Sheets

(51) Int. Cl.
*H01S 5/024* (2006.01)
*H01S 3/04* (2006.01)
*H01S 3/13* (2006.01)
*H01S 5/028* (2006.01)
*H01S 5/0683* (2006.01)
*H01S 3/106* (2006.01)
*H01S 5/06* (2006.01)
*H01S 5/50* (2006.01)
*H01S 5/065* (2006.01)

(52) U.S. Cl.
CPC ........... *H01S 5/065* (2013.01); *H01S 5/0612* (2013.01); *H01S 5/0683* (2013.01); *H01S 5/14* (2013.01); *H01S 5/50* (2013.01)

(56) References Cited

U.S. PATENT DOCUMENTS

2005/0123008 A1* 6/2005 Daiber ................ H01S 5/02446
372/20

2010/0091804 A1* 4/2010 Musio .................... H01S 5/141
372/20

FOREIGN PATENT DOCUMENTS

| | | |
|---|---|---|
| CN | 101908510 A | 12/2010 |
| CN | 101930117 A | 12/2010 |
| CN | 102087371 | 6/2011 |
| CN | 102868090 A | 1/2013 |
| CN | 103515840 A | 1/2014 |
| CN | 103633547 | 3/2014 |
| CN | 103633558 | 3/2014 |
| EP | 1601071 | 11/2005 |
| WO | WO 2005/027286 * 3/2005 | ........... H01S 5/0687 |

OTHER PUBLICATIONS

First Office Action for Chinese Patent Application No. 201410476908X dated Nov. 2, 2016.

Study on MEMS-based External Cavity Tunable Semiconductor Laser: Kun Qian; Chinese Masters Theses Database; Jun. 15, 2014.

* cited by examiner

EXTERNAL CAVITY TUNABLE LASER AND CAVITY MODE LOCKING METHOD THEREOF

CROSS REFERENCE TO RELATED APPLICATIONS

This application is a continuation application of International Application No. PCT/CN2014/087485, filed on Sep. 26, 2014, which claims priority of Chinese Patent Application No. 201410476908.X, filed on Sep. 18, 2014, the entire disclosures of which are incorporated by reference herein in their entireties.

FIELD OF THE INVENTION

The present invention generally relates to a mode locking method for an external cavity tunable laser, and in particular, to a method and device to enable longitudinal mode locking of an external cavity tunable laser. The external cavity tunable laser utilizing the inventive method and device to enable longitudinal mode locking is applicable to an optical communication network with flexible wavelength grid. The present invention belongs to the field of communication.

BACKGROUND OF THE INVENTION

Tunable lasers are widely used in the field of optical communication. Especially with the development of high speed optical communication network in recent years, a demand for tunable narrow linewidth lasers is continuously growing. The tunable lasers will play an important role in the future optical communication network. According to structure, the tunable lasers may be classified as monolithic integrated tunable lasers and external cavity tunable lasers. The monolithic integrated tunable lasers have advantages such as small size and good stability, but at present they have a linewidth larger than that of the external cavity tunable lasers. Thus, the monolithic integrated tunable lasers are not suitable for the development of high speed optical communication network. The external cavity tunable lasers have advantages such as narrow linewidth, large tuning range and less technical challenges, and they have taken a large share in the current commercial 100G optical communication system. Compared with the monolithic integrated lasers, however, the external cavity tunable lasers have worse stability and are more likely to experience mode hopping under the influence of external interference, which degrades characteristics of the laser and thus performance of the optical transmission system. In order to utilize the external cavity tunable lasers, a critical task is to suppress mode hopping thereof. In this regard, monitoring and online-adjusting conditions of the external cavity tunable lasers are very important.

A lot of solutions have been proposed for the external cavity tunable lasers of various structures to suppress mode hopping and accomplish wavelength locking. Generally, such solutions relate to monitoring and compensating for amplitude or phase deviation. A commonly used solution is to determine the output frequency of longitudinal mode by the maximum power algorithm or the special local slope algorithm for optical power spectrum and finely adjust the longitudinal mode output frequency by a phase tuning element in the external cavity, so as to lock the cavity mode. However, to maintain the long term stability of the tunable laser, the phase tuning element should have quick response and a large phase tuning range. Usually, one phase tuning element cannot meet the two requirements at the same time. Therefore, the best choice is to adopt a combination of a phase tuning element with quick response and a phase tuning element with a large phase tuning range.

The external cavity tunable lasers have an obvious drawback of being likely to experience mode hopping under the influence of external interference, which may degrade characteristics of the lasers. Suppressing mode hopping is a sophisticated technology that has to be solved to make use of the external cavity tunable lasers. There have been various solutions proposed for the external cavity tunable lasers with different structures to suppress mode hopping and accomplish mode locking. In general, such solutions relate to monitoring and compensating for amplitude or phase deviation. Therefore, monitoring and online adjustment of conditions of the external cavity tunable lasers are very important.

SUMMARY OF THE INVENTION

The present invention aims to overcome one or more technical defects in the art. With regard to cavity mode monitoring and external cavity phase control of the external cavity tunable laser, the present invention proposes an external cavity tunable laser and a cavity mode locking method therefor. A main control unit of the laser monitors small changes in optical output frequency of the laser by reading optical power samples from an optical power detector, and a real-time and effective hybrid method for external cavity phase control is adopted to realize precise control over stability and wavelength of the cavity mode of the laser.

An aspect of the present invention provides external cavity tunable laser comprising a semiconductor amplifier having a partial reflective film provided on one end and an anti-reflective film provided on the other end, a cavity mirror provided at the anti-reflective end of the semiconductor amplifier to define an external cavity therebetween, a large-range phasing assembly and a quick phasing assembly provided to adjust the optical length of the external cavity independently, an optical power detector provided at the partial reflective end of the semiconductor amplifier to detect the optical power of the light output from the semiconductor amplifier, and a control unit in communication with the optical power detector, the large-range phasing assembly, and the quick phasing assembly. The control unit is configured to perform the following steps: monitoring whether a difference between the output optical power value received from the optical power detector and a previous maximum output optical power value ($P1_{Max}$) in a cavity mode locking state is higher than a threshold, if yes, changing the driving input ($D_f$) of the quick phasing assembly to obtain a present maximum output optical power value ($P2_{Max}$), converting the driving input change ($D_f$-$CD_f$) of the quick phasing assembly to a driving input change ($\Delta D_L$) of the large-range phasing assembly, and adjusting the driving input of the large-range phasing assembly according to the converted driving input change and resetting the quick phasing assembly to the original driving input so as to realize cavity mode locking.

In some embodiments, the quick phasing assembly may comprise a displacement control element fixed to the cavity mirror to move the cavity mirror in a direction perpendicular to the mirror surface. As an example, the quick phasing assembly may comprise PZT.

In some embodiments, the large-range phasing assembly may comprise one or more controlled optical assemblies disposed between the semiconductor amplifier and the cavity mirror controlled by the control unit to change refractive indexes or thicknesses so as to adjust the optical length of the external cavity.

In some embodiments, the controlled optical assembly may comprise a temperature adjustable thermo-optic assembly based on the thermo-optic effect or a driving-voltage or driving-current adjustable electro-optic assembly based on the electro-optic effect.

In some embodiments, the temperature adjustable thermo-optic assembly may comprise a silicon plate having anti-reflective films provided on both light-passing surfaces, a heating resistor attached to a non-light region of one of the light-passing surfaces, and a temperature sensor attached to a non-light region of the other of the light-passing surfaces, and the control unit may be in communication with the heating resistor and the temperature sensor to control the temperature of the silicon plate.

In some embodiments, the driving-voltage or driving-current adjustable electro-optic assembly may comprise a phase adjustable liquid crystal sheet having anti-reflective films provided on both light-passing surfaces. The control unit may be configured to rotate the optical axis of the liquid crystal sheet by controlling its driving voltage or current, thereby adjusting the refractive index of the liquid crystal sheet and thus the optical length of the external cavity.

In some embodiments, the large-range phasing assembly may comprise a substrate having the cavity mirror and the quick phasing assembly disposed thereon, a temperature sensor disposed on the substrate, and a semiconductor cooler disposed below the substrate. The control unit may be in communication with the temperature sensor and the semiconductor cooler and configured to adjust the optical length of the external cavity by controlling the temperature of the substrate.

In some embodiments, the control unit may be further configured to receive an instruction to switch the optical channel wavelength of the laser and, in response to the instruction, adjust the driving input of the large-range phasing assembly within a predetermined range to achieve a maximum optical output power.

In some embodiments, the large-range phasing assembly may comprise a first large-range phasing assembly and a second large-range phasing assembly. The control unit may adjust the first large-range phasing assembly in response to the instruction to switch the optical channel wavelength of the laser and performs the converting and adjusting steps on the second large-range phasing assembly.

In some embodiments, the external cavity tunable laser may further comprise a beam splitter to split the output beam from the semiconductor amplifier into two sub-beams, one of which is directed to an output optical fiber and the other is directed to the optical power detector.

In some embodiments, the external cavity tunable laser may further comprise a beam expanding and collimation lens disposed between the semiconductor amplifier and the cavity mirror, and a plurality of filters disposed between the beam expanding and collimation lens and the cavity mirror.

In some embodiments, the external cavity tunable laser may further comprise a first output beam collimation lens disposed between the semiconductor amplifier and the beam splitter, an optical isolator disposed downstream the beam splitter, and a second output beam collimation lens disposed downstream the optical isolator to direct the output beam to the output optical fiber.

Another aspect of the present invention provides a cavity mode locking method for an external cavity tunable laser including a semiconductor amplifier having a partial reflective end and an anti-reflective end, a cavity mirror provided at the anti-reflective end of the semiconductor amplifier to define an external cavity therebetween, a large-range phasing assembly a quick phasing assembly provided to adjust the optical length of the external cavity independently, an optical power detector to detect the optical power of the light output from the semiconductor amplifier, and a control unit in communication with the optical power detector, the large-range phasing assembly, and the quick phasing assembly. The method may comprise the control unit monitoring whether a difference between the output optical power value received from the optical power detector and a previous maximum output optical power value ($P1_{Max}$) in a cavity mode locking state is higher than a threshold, if yes, the control unit changing the driving input ($D_f$) of the quick phasing assembly to obtain a present maximum output optical power value ($P2_{Max}$), the control unit converting the driving input change ($D_f-CD_f$) of the quick phasing assembly to a driving input change ($\Delta D_L$) of the large-range phasing assembly, and the control unit adjusting the driving input of the large-range phasing assembly according to the converted driving input change and resetting the quick phasing assembly to the original driving input so as to realize cavity mode locking.

In some embodiments, the method may further comprise the control unit receiving an instruction to switch the optical channel wavelength of the laser, and in response to the instruction, the control unit adjusting the driving input of the large-range phasing assembly within a predetermined range to obtain a maximum optical output power.

In some embodiments, the large-range phasing assembly may comprise a first large-range phasing assembly and a second large-range phasing assembly. The control unit may adjust the first large-range phasing assembly in response to the instruction to switch the optical channel wavelength of the laser and perform the converting and adjusting steps on the second large-range phasing assembly.

In some embodiments, converting the driving input change ($D_f-CD_f$) of the quick phasing assembly to a driving input change ($\Delta D_L$) of the large-range phasing assembly is performed according to the equation $\Delta D_L=K*(D_f-CD_f)$, $\Delta D_L$ represents the driving input change of the large-range phasing assembly, $D_f$ represents the driving input of the quick phasing assembly corresponding to the previous maximum output optical power value ($P1_{Max}$), $CD_f$ represents the driving input of the quick phasing assembly corresponding to the present maximum output optical power value ($P2_{Max}$), and K represents a linear scaling factor between the quick phasing assembly and the large-range phasing assembly.

In some embodiments, the linear scaling factor K is determined by the following steps: monitoring output frequency of the laser while changing the driving input of the quick phasing assembly to move the cavity mirror and change the optical length of the external cavity, thereby obtaining an equation $y_p=k_1 x_p+b_1$ representing a relationship between the driving input $x_p$ of the quick phasing assembly and the output frequency $y_p$ of the laser; monitoring output frequency of the laser while changing the driving input of the large-range phasing assembly to change the optical length of the external cavity, thereby obtaining an equation $y_b=k_2 x_b+b_2$ representing a relationship between the driving input $x_b$ of the large-range phasing assembly and the output frequency $y_b$ of the laser; and determine the linear scaling factor $K=k_1/k_2$.

In some embodiments, the large-range phasing assembly may comprise a temperature adjustable thermo-optic assembly based on the thermo-optic effect, or a driving-voltage or driving-current adjustable electro-optic assembly based on the electro-optic effect. The driving input of the large-range phasing assembly may be the temperature of the thermo-optic assembly or the driving voltage or current of the electro-optic assembly.

In some embodiments, the quick phasing assembly may comprise a PZT element, and the driving input of the quick phasing assembly is the loading voltage of the PZT element.

The present invention has the following advantages and positive effects:

1. The external cavity of the inventive laser includes a plurality of (at least 2) active phasing assemblies, one of which can implement quick phase adjustment to detect the phase compensation amount of the external cavity in real-time, and the other can carry out the phase adjustment in real-time. The plurality of phase adjustors in the external cavity will improve the phase adjustment speed and increase the phase adjustment amount of the external cavity. The present invention can realize real-time and quick locking of the laser's cavity mode and long term stability of the laser even in different conditions.

2. The inventive laser can achieve a precise output wavelength with a simple structure. The main control unit of the laser monitors small changes in optical output frequency of the laser by reading optical power samples from an optical power detector, and a real-time and effective hybrid method for external cavity phase control is adopted to realize precise control over stability and wavelength of the cavity mode of the laser.

| Reference signs: | |
|---|---|
| 1. Semiconductor optical amplifier | 2. Beam expanding and collimation lens |
| 3. Tunable filter | 4. Fixed grid filter |
| 5. Large-range phasing assembly | 5-1. First large-range phasing assembly |
| 5-2. Second large-range phasing assembly | 6. External cavity mirror |
| 7. Quick phasing assembly | 8. First output beam collimation lens |
| 9. Second output beam collimation lens | 10. Beam splitter |
| 11. Optical isolator | 12. Optical power detector |
| 13. Control unit | 14. Output optical fiber |

| Reference signs: | |
|---|---|
| 15. Temperature sensor | 17. Semiconductor cooler |
| 16. Substrate | |

DETAILED DESCRIPTION OF THE PREFERRED EMBODIMENTS

Further description will be made in connection with the drawings and embodiments.

The external cavity tunable laser has a plurality of cavity resonant modes. A narrow band filter may be added into the cavity so that the laser may operate in a single mode. The external cavity tunable laser may be realized by use of a tunable narrow band filter in the cavity.

Figure 1:
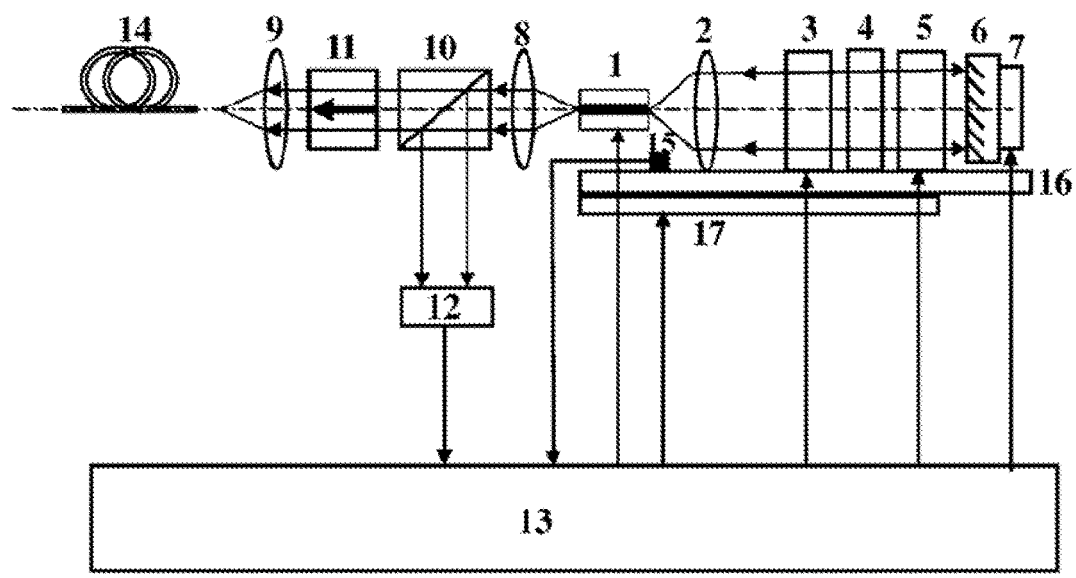
FIG. 1 is a schematic diagram showing an external cavity tunable laser with a wavelength locking function according to a first embodiment of the present invention.

FIG. 1 shows an external cavity tunable laser according to a first embodiment of the present invention. As shown in FIG. 1, the external cavity tunable laser may comprise a semiconductor optical amplifier 1, a beam expanding and collimation lens 2, a tunable filter 3, a fixed grid filter 4, a large-range phasing assembly 5, an external cavity mirror 6, a quick phasing assembly 7, a first output beam collimation lens 8, a second output beam collimation lens 9, a beam splitter 10, an optical isolator 11, an optical power detector 12, and a control unit 13. An optical fiber 14 may be provided to receive light from the external cavity tunable laser of FIG. 1. The semiconductor optical amplifier 1 is used to provide optical gain, and two sides of the semiconductor optical amplifier 1 are plated with a partial reflective film and an anti-reflective film, respectively. The beam expanding and collimation lens 2, the tunable filter 3, the fixed grid filter 4, the large-range phasing assembly 5, the external cavity mirror 6, and the quick phasing assembly 7 are arranged in this order on the side of the semiconductor optical amplifier 1 plated with the anti-reflective film, constituting the external cavity of the external cavity tunable laser. All the external cavity components of the laser and the temperature sensor 15 are provided on the substrate 16, and the semiconductor cooler 17 is provided on the other side of the substrate 16. The semiconductor cooler 17 and the temperature sensor 15 are connected to the control unit 13, as shown in FIG. 1. The first output beam collimation lens 8, the beam splitter 10, the isolator 11, the second output beam collimation lens 9, and the output optical fiber 14 are arranged in this order on the side of the semiconductor optical amplifier 1 plated with the partial reflective film, constituting the coupling-output optical path of the external cavity tunable laser. The beam splitter 10 splits the output laser beam into two parts, the smaller of which is directed to the optical power detector 12 so as to periodically sample the output optical power under the control of the control unit 13. The other part of the output laser beam passes through the optical isolator 11 and then is coupled into the output optical fiber 14 through the second output beam collimation lens 9. The control unit 13 comprises a reading module connected to the optical power detector 12, a calculation module connected to the reading module, a driving module connected to the calculation module, the large-range phasing assembly 5, the quick phasing assembly 7, and the tunable filter 3, and an external cavity temperature control module connected to the semiconductor cooler 17 and the temperature sensor 15.

In the embodiment, the tunable filter 3, the fixed grid filter 4, and the large-range phasing assembly 5 may be disposed at any position between the beam expanding and collimation lens 2 and the external cavity mirror 6, not being limited to the configuration shown in FIG. 1. That is to say, the external cavity of the external cavity tunable laser is disposed on the side of the anti-reflective film and comprises the beam expanding and collimation lens 2, the external cavity mirror 6, and the tunable filter 3 and the fixed grid filter 4 disposed between the beam expanding and collimation lens 2 and the external cavity mirror 6, and the tunable filter 3 and the fixed grid filter 4 may exchange positions with each other. The large-range phasing assembly 5 may be disposed at any point in the optical path between the beam expanding and collimation lens 2 and the external cavity mirror 6 in the external cavity.

The components in the configuration of this embodiment function as follows:

An electric current may be injected into the semiconductor optical amplifier 1, where the current is converted into broadband photons through spontaneous emission due to the photoelectric conversion. These photons travel towards two ends along the waveguide. A part of photons having a specific frequency may promulgate back and forth in the resonant cavity and be amplified during oscillation in the cavity. When meeting the critical condition, the photons emit from the partial reflective end of the semiconductor optical amplifier 1, forming a laser beam.

The fixed grid filter 4 may be a Fabry-Perot etalon or other filters having a periodic grid. As for the laser used in a Dense Wavelength Division Multiplexing (DWDM) system, the period corresponds to the standard DWDM channel spacing as specified by ITU-T, such as 25 GHz, 50 GHz, 100 GHz or 200 GHz.

The active large-range phasing assembly 5 and the quick phasing assembly 7 both are used to change the length of the external cavity of the laser. Specifically, the quick phasing assembly 7 is used to quickly detect an amount of phase compensation for the external cavity, and the active large-range phasing assembly 5 may adjust the cavity length of the laser in a larger range and thus functions as a unit that actually carries out the phase compensation for the external cavity.

The tunable filter 3, the quick phasing assembly 7 and the active large-range phasing assembly 5 cooperate with each other to tune frequency of the laser. The optimum cavity-mode wavelength output of the external cavity tunable laser corresponds to the maximum optical power sampling value, and a change of the optical power sampling value reflects a small change of the output optical frequency of the laser.

The quick phasing assembly 7 is a displacement control element that is fixed onto the external cavity mirror 6 and drives the external cavity mirror 6 to move slightly and quickly along the direction perpendicular to the mirror surface. In the embodiment, the quick phasing assembly 7 may comprise Piezoelectric Transducer (PZT) to precisely control position of the external cavity mirror 6 so as to realize phase adjustment. The optical power detector 12 can monitor changes in power and frequency of the output of the laser and provides them to the frequency stabilization system as for feedback control.

In the external cavity tunable laser of FIG. 1 according to the first embodiment of the present invention, the external cavity is controlled to have a constant temperature, and the laser is provided with a separate large-range phasing assembly 5 to adjust the length of the external cavity in a large range. The large-range phasing assembly 5 may adopt a temperature adjustable thermo-optic assembly based on the thermo-optic effect, or a driving voltage or current adjustable optical assembly based on the electro-optic effect. The thermo-optic assembly of the large-range phasing assembly 5 may comprise a silicon plate having anti-reflective films plated on its light-passing surfaces, a heating resistor and a temperature sensor. The heating resistor and temperature sensor are attached onto a non-light region of the light passing surfaces on the front and back sides of the silicon plate, respectively, and connected to the control unit 13 so as to implement close-loop control over temperature of the silicon plate. The silicon plate may have its optical path changed by controlling the temperature, so that the cavity length of the external cavity tunable laser may be changed, thereby compensating for phase of the cavity mode. The large-range phasing assembly 5 based on the electro-optic effect may also adopt a phase adjustable liquid crystal (LC) sheet having anti-reflective films plated on the light-passing surfaces thereof. The control unit 13 may control the loading voltage of the LC sheet to rotate its optical axis, thereby changing the refractive index and thus the effective optical path of the LC sheet.

Figure 2:
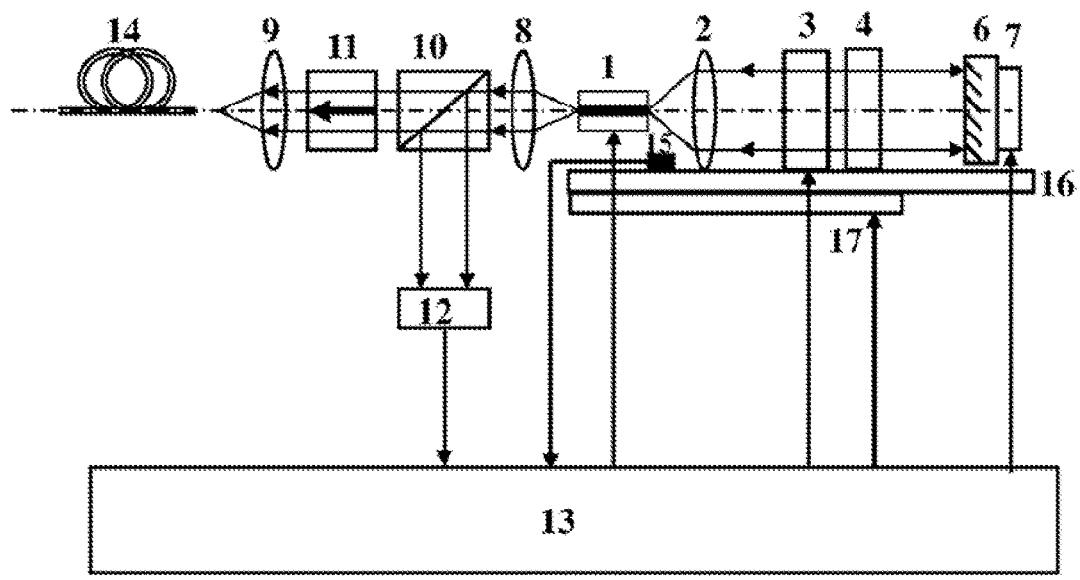
FIG. 2 is a schematic diagram showing an external cavity tunable laser with a wavelength locking function according to a second embodiment of the present invention.

FIG. 2 shows an external cavity tunable laser according to a second embodiment of the present invention, which does not include a separate active large-range phasing assembly. That is, the large-range phasing assembly 5 is removed. Instead, the function of the large-range phasing assembly 5 is achieved by the substrate 16, the semiconductor cooler 17, and the temperature sensor 15. The semiconductor cooler 17 and the temperature sensor 15 are connected to the control unit 13 of the system. The substrate 16 has the thermal expansion effect. When the control unit 13 changes the temperature of the semiconductor cooler 17, the length of the substrate 16 will change accordingly, and thus the length of the external cavity will change.

The embodiments of the present invention may include but not limited to one or two types of large-range phasing assembly 5, and the large-range phasing assembly 5 may include one or more phasing components in combination with each other. The quick phasing assembly 7 may include but not limited to PZT and components that may realize displacement control via external controlling means. The large-range phasing assembly 5 includes but not limited to optical-path variable components based on the electro-optic effect, the thermo-optic effect, and various stress sensing technologies.

Figure 3:
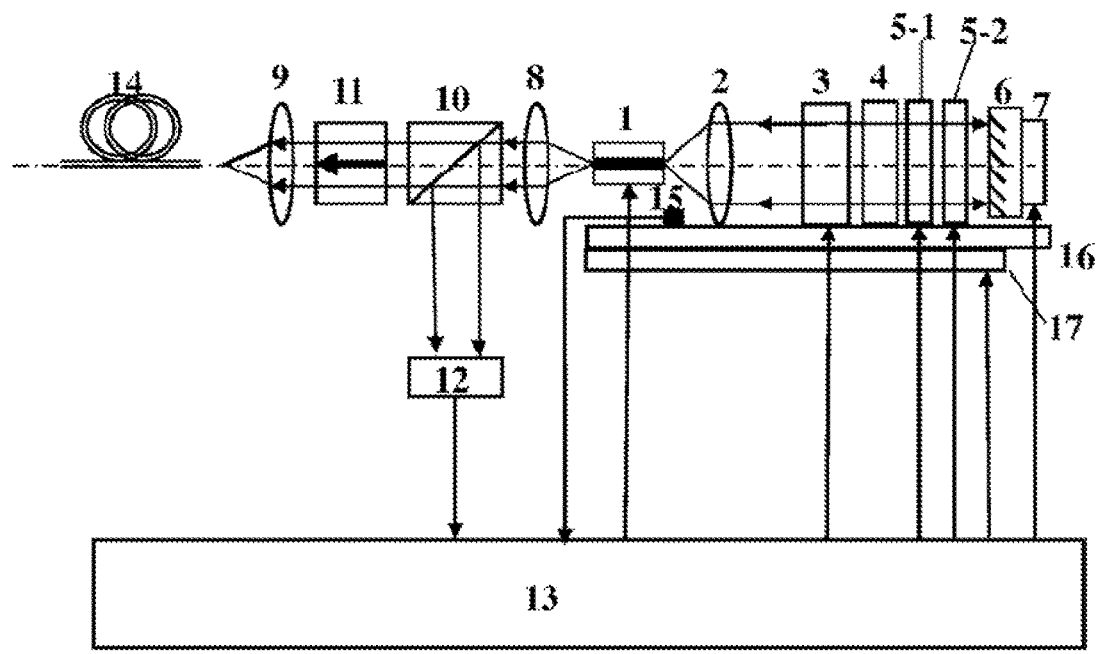
FIG. 3 is a schematic diagram showing an external cavity tunable laser with a wavelength locking function according to a third embodiment of the present invention.

FIG. 3 shows an external cavity tunable laser according to a third embodiment of the present invention. The external cavity is controlled to have a constant temperature, and the laser is provided with a first large-range phasing assembly 5-1 and a second large-range phasing assembly 5-2 different than and separate from each other. The first large-range phasing assembly 5-1 and the second large-range phasing assembly 5-2 constitute the large-range phasing assembly. The first large-range phasing assembly 5-1 and the second large-range phasing assembly 5-2 may adopt a temperature adjustable thermo-optic component based on the thermo-optic effect, or a driving voltage or current adjustable optical component based on the electro-optic effect. The thermo-optic component of the first large-range phasing assembly 5-1 may include a silicon plate having anti-reflective films plated on its light-passing surfaces, a heating resistor and a temperature sensor. The heating resistor and the temperature sensor may be affixed onto a non-light region of the light-passing surfaces of the silicon plate on the front and back sides, respectively, and they are connected to the control unit 13 to realize close-loop control over temperature of the silicon plate. The silicon plate may have its optical path changed by controlling the temperature, so that the cavity length of the external cavity tunable laser may be changed, thereby compensating for phase of the cavity mode. The second large-range phasing assembly 5-2 based on the electro-optic effect may also adopt a phase adjustable liquid crystal (LC) sheet having anti-reflective films plated on the light-passing surfaces thereof. The control unit 13 may control the loading voltage of the LC sheet to rotate its optical axis, thereby changing the refractive index and thus the effective optical path of the LC sheet. During switching the optical channel wavelength of the external cavity tunable laser, the control unit 13 drives the second large-range phasing assembly 5-2 to adjust the length of the external cavity so as to realize a precise output wavelength. During the continuous cavity mode locking, the second large-range phasing assembly 5-2 has constant driving input. The phase compensation amount is converted between the quick phasing assembly and the large-range phasing assembly by a special calibration algorithm so as to realize frequency stabilization.

Figure 4:
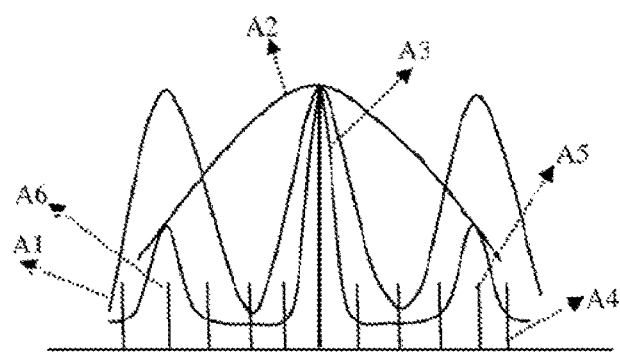
FIG. 4 is a schematic graph showing the transmission spectrums of the tunable filter and the periodic grid filter and the mode spectrum of the external cavity tunable laser.
Figure 5:
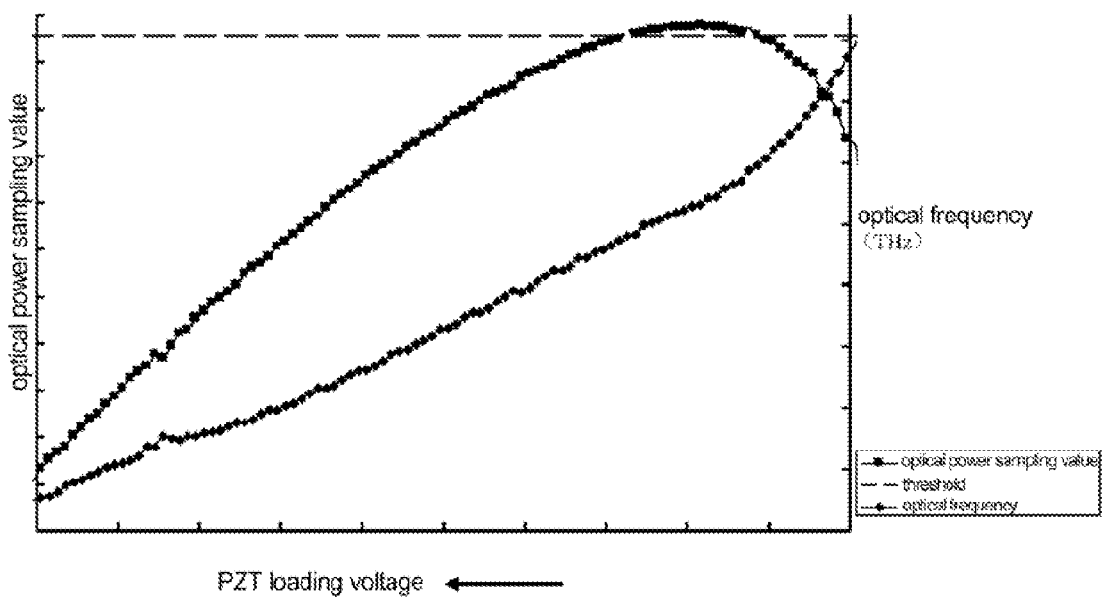
FIG. 5 is a plot showing the optical output frequency of the laser as a function of the PZT loading voltage of the quick phasing assembly.

Operation of the external cavity tunable laser according to embodiments of the present invention will be discussed below. FIG. 4 shows the transmission spectrums of the tunable filter 3 and the fixed grid filter 4 and the mode spectrum of the external cavity tunable laser. As shown in FIG. 4, the curve A1 represents the transmission spectrum of the fixed grid filter 4, the curve A2 represents the transmission spectrum of the tunable filter 3, and the lines A4, A5, and A6 represent mode spectrums of the resonant cavity. An ITU-T output wavelength may be set for the tunable laser. A2 and A1 have a transmission peak aligned with each other. The synthetic transmission spectrum of the tunable filter 3 and the fixed grid filter 4 is A3, which has a main transmission peak whose transmissivity is much larger than other secondary peaks. By moving the cavity mode of the external cavity tunable laser through an external cavity phase tuning mechanism, the cavity mode of the laser closest to the main transmission peak may coincide with the main transmission peak of the synthetic transmission spectrum, resulting in a gain in the external cavity much higher than other cavity modes. In such a case, the laser will operate in a single mode and provide a maximum output power, realizing the optimum wavelength locking condition. If no mode hopping occurs, the cavity mode of the laser closest to the main transmission peak first gradually approaches the main transmission peak along a direction that the optical frequency becomes higher (the optical path of the external cavity gradually becomes shorter), and then gradually moves away from the main transmission peak, resulting in the curve of FIG. 5 showing dependence of the output frequency and the optical power sampling value of the laser on the phase of the external cavity. As shown in FIG. 5, the phase of the external cavity gradually becomes lower along the positive X axis. The optimum output wavelength corresponds to the maximum optical power sampling value, and change of the optical power sampling value reflects small change of the output optical frequency of the laser. The change of the output optical frequency of the laser is substantially linearly proportional to the change of the phase of the external cavity. According to this theory, the present invention proposes a cavity mode locking method including an optical channel wavelength switching stage and a continuous cavity mode locking stage.

The cavity mode locking method for the external cavity tunable laser according to an embodiment of the present invention will be discussed below in the context of the forgoing first embodiment including the large-range phasing assembly 5 based on the thermo-optic effect as an example.

Figure 6:
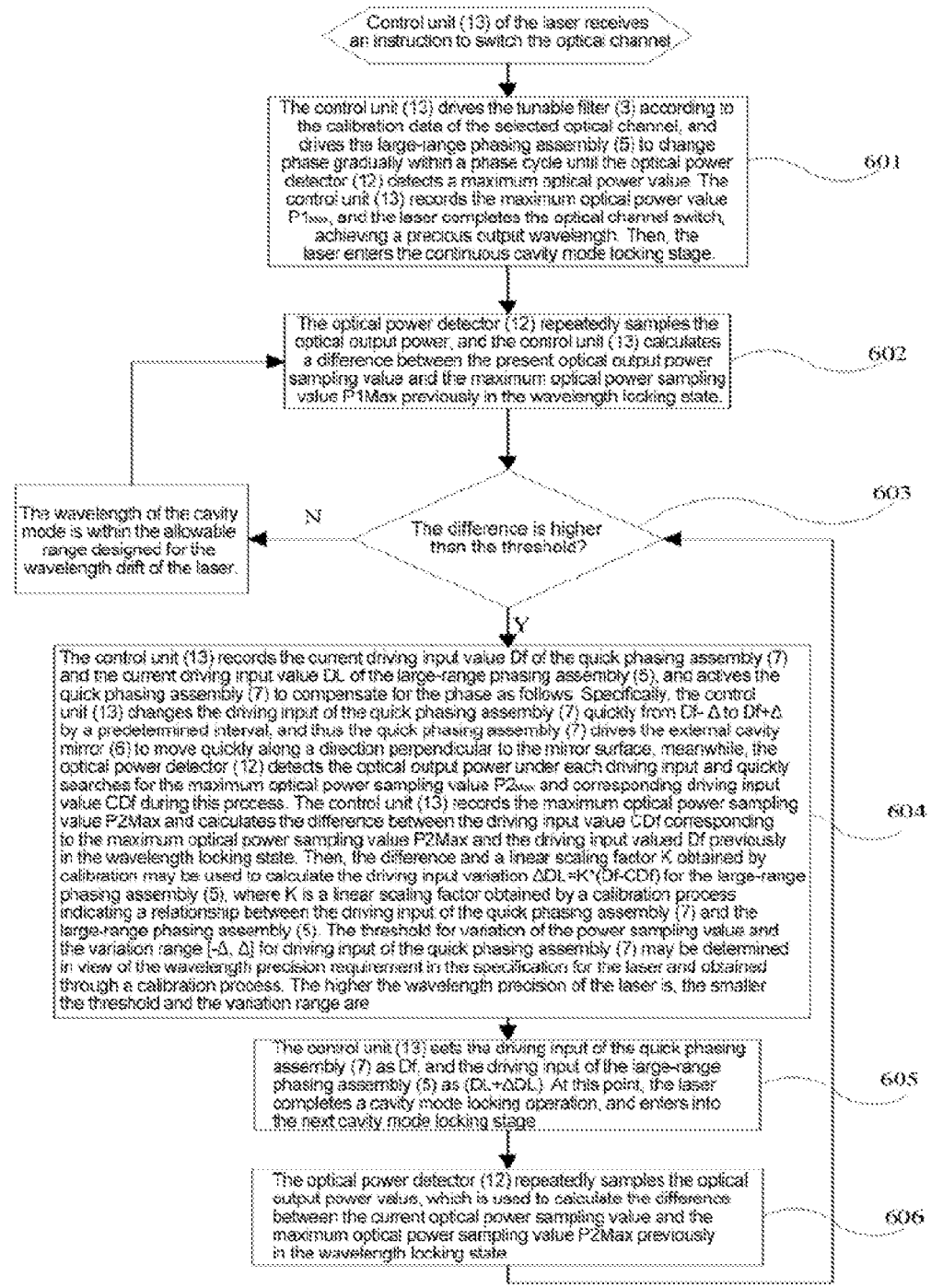
FIG. 6 is a flow chart showing a cavity mode locking method for the external cavity tunable laser according to an embodiment of the present invention.

FIG. 6 is the flow chart showing the method. Specifically, the method may include the following steps.

Step 601: The control unit 13 of the laser receives an instruction to switch the optical channel wavelength, and drives the tunable filter 3 according to the calibration data for the selected optical channel wavelength. The control unit 13 gradually decreases the temperature of the large-range phasing assembly 5 by a predetermined interval within a temperature range to search for the optimum compensating phase within a phase cycle, until the optical power detected by the optical power detector 12 reaches a maximum value. The control unit 13 records the maximum optical power sampling value P1$_{Max}$. The laser completes the optical channel switch, achieving output of a precise wavelength. Then, the method proceeds to the next stage of continuous cavity mode locking.

Step 602: The optical power detector 12 repeatedly samples the optical output power, and the control unit 13 calculates the difference between the present optical power sampling value and the maximum optical power sampling value P1$_{Max}$ previously in the wavelength locking state.

Step 603: It is determined whether the difference for the optical power sampling value is higher than a predetermined threshold value.

Step 604: If the difference is higher than the threshold value, the control unit 13 records the current driving input value D$_f$ of the quick phasing assembly 7 and the current driving input value D$_L$ of the large-range phasing assembly 5, and actives the quick phasing assembly 7 to compensate for the phase as follows. Specifically, the control unit 13 changes the driving input of the quick phasing assembly 7 quickly from D$_f$−Δ to D$_f$+Δ by a predetermined interval, and thus the quick phasing assembly 7 drives the external cavity mirror 6 to move quickly along a direction perpendicular to the mirror surface, which causes the optical output power of the laser to vary. Meanwhile, the optical power detector 12 detects the optical output power under each driving input and quickly searches for the maximum optical power sampling value P2$_{Max}$ and corresponding driving input value CD$_f$ during this process. The control unit 13 records the maximum optical power sampling value P2$_{Max}$ and calculates the difference between the driving input value CD$_f$ corresponding to the maximum optical power sampling value P2$_{Max}$ and the driving input value D$_f$ previously in the wavelength locking state. Then, the difference may be used to calculate the driving input variation ΔD$_L$=K*(D$_f$−CD$_f$) for the large-range phasing assembly 5, where K is a linear scaling factor obtained by a calibration process indicating a relationship between the driving input of the quick phasing assembly 7 and the large-range phasing assembly 5. The threshold for variation of the power sampling value and the variation range [−Δ, Δ] for driving input of the quick phasing assembly 7 may be determined in view of the wavelength precision requirement for the laser. The higher the wavelength precision of the laser is, the smaller the threshold and the variation range are. In other words, when the variation of the power sampling value is lower than the threshold and the variation of the driving input is within the range of [−Δ, Δ], the output wavelength of the laser meets the wavelength precision requirement for the laser.

Step 605: The control unit 13 sets the driving input of the quick phasing assembly 7 as D$_f$, and the driving input of the large-range phasing assembly 5 as (D$_L$+ΔD$_L$). At this point, the laser completes a cavity mode locking operation, and enters into the next cavity mode locking stage.

Step 606: The optical power detector 12 repeatedly samples the optical output power value, and the control unit 13 calculates the difference between the current optical power sampling value and the maximum optical power sampling value $P2_{Max}$ previously in the wavelength locking state.

The steps 603 to 606 repeat so as to realize the real-time cavity mode locking of the laser. In the whole process, the temperature of the external cavity is constant, and the output wavelength of the laser is stable within the range required in the design specification.

The above-mentioned cavity mode locking method is applicable not only to the external cavity tunable laser according to the first embodiment of the present invention, but also to the external cavity tunable lasers according to the second and third embodiments of the present invention. When the method is applied to the external cavity tunable laser according to the second embodiment, the control unit 13 will control the temperature through the semiconductor cooler 17 and the temperature sensor 15 so as to achieve the same function as operations the control unit 13 performs on the large-range phasing assembly 5 when the method is applied to the first embodiment. When the cavity mode locking method is applied to the external cavity tunable laser according to the third embodiment of the present invention, in the optical channel switching stage of Step 601, the control unit 13 drives the first large-range phasing assembly 5-1 to adjust the length of the external cavity and achieve a precise output wavelength. In the continuous cavity mode locking and frequency stabilization stage of Step 602-606, the driving input of the second large-range phasing assembly 5-2 remains unchanged, and the phase compensation amount is converted between the quick phasing assembly 7 and the large-range phasing assembly 5-1.

In the cavity mode locking method, only if the difference between the present optical power sampling value and the previous maximum optical power sampling value in the wavelength locking state is higher than the threshold, the active phase compensation operations will be implemented. The threshold for the variation of the optical power sampling value may be determined in view of the wavelength precision required in the laser's specification. That is, when the variation of the optical power sampling value is within the threshold, the output wavelength of the laser meets the requirement for wavelength precision in the laser specification. The present optical power sampling value is compared with the maximum optical power sampling value in the previous wavelength locking state to determine whether or not to initiate the next wavelength locking operation.

In the cavity mode locking method of the present invention, the quick phasing assembly 7 detects the amount of phase compensation for the external cavity. Then, the amount of phase compensation detected by the quick phasing assembly 7 is converted to an amount for other phasing components through the linear factor K for the phase adjustment sensitivity conversion between the quick phasing assembly 7 and other phasing components (the large-range phasing assembly 5, and the temperature control subsystem including the semiconductor cooler 17 and the temperature sensor 15). Thus, the phase compensation may be implemented by the other phasing components.

The calibration method to determine the scaling factor K referred in Step 604 of the cavity mode locking method will be discussed below with the first embodiment as an example. Assuming that the quick phasing assembly 7 is implemented by PZT, and the large-range phasing assembly 5 is implemented by a monocrystal silicon plate having anti-reflective films plated on both sides thereof which may be heated to perform phase adjustment.

Figure 7:
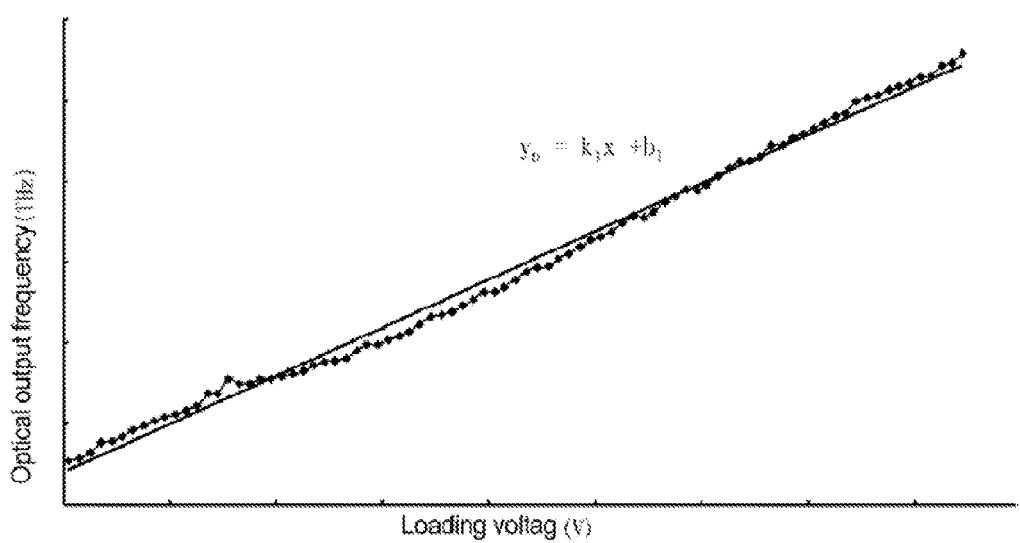
FIG. 7 is a plot showing a typical dependence of the optical output frequency and the sample optical power on the phase variation of the external cavity for the laser.

The linear scaling factor K may be determined as follows. The external cavity tunable laser realizes a stable output wavelength according to Step 601. Then, the loading voltage of the PZT increases gradually, which drives the external cavity mirror to move inwards the cavity, and shortens the cavity length. Meanwhile, variation of the output optical frequency of the laser is monitored, obtaining dependence of the output optical frequency on the PZT loading voltage as shown in FIG. 7. Referring to FIG. 7, the external cavity phase varies monotonically in a small range, and the laser does not experience mode hopping in the whole process. The PZT loading voltage $x_p$ and the output optical frequency $y_p$ of the laser may be linearly fitted with the following equation:

$$y_p = k_1 x_p + b_1$$

In a similar way, by decreasing the temperature of the monocrystal silicon plate of the large-range phasing assembly and monitoring the variation of the output optical frequency of the laser, an approximately linear fitting between the temperature $x_b$ of the monocrystal silicon plate and the output optical frequency $y_b$ of the laser may be obtained.

$$y_b = k_2 x_b + b_2$$

The scaling factor K referred in Step 604 of the cavity mode locking method can be calculated by the following equation:

$$K = k_1 / k_2$$

The linear scaling factor K may be written in a fixed position of an EEPROM included in the control unit 13 and used to convert the driving input variation between different phase tuning mechanisms.

As seen from the above, the wavelength locking device of the present invention can precisely lock the output wavelength with a simple structure. The control unit of the laser may obtain the output optical power sampling value from the optical power detector and monitor small changes of the output optical frequency of the laser. Using a real-time and effective hybrid method for external cavity phase control, the control unit can realize precise control over the stability and wavelength of the cavity mode of the laser. The external cavity may have a plurality of phase compensators, which greatly increases the compensation amount of the external cavity. The quick phasing assembly may be realized by PZT which can precisely control the position of the external cavity mirror. The large-range phasing assembly may be realized by a thermo-optic assembly provided with a heating unit to control its temperature. By controlling the temperature of the thermo-optic assembly, the optical path of the thermo-optic assembly may be changed, and thus the cavity length of the external cavity tunable laser may be changed to compensate for the phase of the cavity mode.

While the embodiments of the present invention have been described, the present invention is not limited to those embodiments. It is apparent for those skilled in the art that many modifications and changes may be made to the present invention. Any modifications, equivalents and improvements made within the spirit and principle of the present invention shall fall within the protection scope of the invention.

While some specific embodiments of the invention have been described by way of example, those skilled in the art may appreciate from reading and understanding of the specification and drawings that various changes in form and details may be made to the inventive device without departing from the spirit and scope of the invention, especially functions as discussed above. Such changes shall fall within the scope of the accompanying claims and their equivalents.

The invention claimed is:

1. An external cavity tunable laser comprising:
a semiconductor amplifier having a partial reflective film provided on one end and an anti-reflective film provided on the other end;
a cavity mirror provided at the anti-reflective end of the semiconductor amplifier to define an external cavity therebetween;
a large-range phasing assembly and a quick phasing assembly provided to adjust the optical length of the external cavity independently, wherein the large-range phasing assembly comprises at least one temperature adjustable thermo-optic assembly having a silicon plate with light-passing surfaces and anti-reflective films provided on both light-passing surfaces, a heating resistor attached to a non-light region of one of the light-passing surfaces, and a temperature sensor attached to a non-light region of the other of the light-passing surfaces, wherein the large-range phasing assembly further comprises a substrate having the cavity mirror and the quick phasing assembly disposed thereon, the temperature sensor being disposed on the substrate, and a semiconductor cooler disposed below the substrate;
an optical power detector provided at the partial reflective end of the semiconductor amplifier to detect the optical power of the light output from the semiconductor amplifier; and
a control unit in communication with the optical power detector, the large-range phasing assembly, and the quick phasing assembly, the control unit also in communication with the heating resistor and the temperature sensor to control the temperature of the silicon plate, the control unit also in communication with the temperature sensor and the semiconductor cooler and configured to adjust the optical length of the external cavity by controlling the temperature of the substrate, the control unit being configured to perform the following steps:
monitoring whether a difference between the output optical power value received from the optical power detector and a previous maximum output optical power value ($P1_{Max}$) in a cavity mode locking state is higher than a threshold;
if yes, changing the driving input ($D_f$) of the quick phasing assembly to obtain a present maximum output optical power value ($P2_{Max}$);
converting the driving input change ($D_f$-$CD_f$) of the quick phasing assembly to a driving input change ($\Delta D_L$) of the large-range phasing assembly; and
adjusting the driving input of the large-range phasing assembly according to the converted driving input change and resetting the quick phasing assembly to the original driving input, so as to realize cavity mode locking.

2. The external cavity tunable laser of claim 1, wherein the quick phasing assembly comprises a displacement control element fixed to the cavity mirror to move the cavity mirror in a direction perpendicular to the mirror surface.

3. The external cavity tunable laser of claim 2, wherein the quick phasing assembly comprises PZT.

4. The external cavity tunable laser of claim 1, wherein the large-range phasing assembly comprises one or more controlled optical assemblies disposed between the semiconductor amplifier and the cavity mirror controlled by the control unit to change refractive indexes or thicknesses so as to adjust the optical length of the external cavity.

5. The external cavity tunable laser of claim 4, wherein the controlled optical assembly comprises a driving-voltage or driving-current adjustable electro-optic assembly based on the electro-optic effect.

6. The external cavity tunable laser of claim 5, wherein the driving-voltage or driving-current adjustable electro-optic assembly comprises a phase adjustable liquid crystal sheet having anti-reflective films provided on both light-passing surfaces, and the control unit is configured to rotate the optical axis of the liquid crystal sheet by controlling its driving voltage or current, thereby adjusting the refractive index of the liquid crystal sheet and thus the optical length of the external cavity.

7. The external cavity tunable laser of claim 1, wherein the control unit is further configured to receive an instruction to switch the optical channel wavelength of the laser and, in response to the instruction, adjust the driving input of the large-range phasing assembly within a predetermined range to achieve a maximum optical output power.

8. The external cavity tunable laser of claim 7, wherein the large-range phasing assembly comprises a first large-range phasing assembly and a second large-range phasing assembly, the control unit adjusts the first large-range phasing assembly in response to the instruction to switch the optical channel wavelength of the laser and performs the converting and adjusting steps on the second large-range phasing assembly.

9. The external cavity tunable laser of claim 1, further comprising a beam splitter to split the output beam from the semiconductor amplifier into two sub-beams, one of which is directed to an output optical fiber and the other is directed to the optical power detector.

10. The external cavity tunable laser of claim 9, further comprising:
a beam expanding and collimation lens disposed between the semiconductor amplifier and the cavity mirror; and
a plurality of filters disposed between the beam expanding and collimation lens and the cavity mirror.

11. The external cavity tunable laser of claim 10, further comprising:
a first output beam collimation lens disposed between the semiconductor amplifier and the beam splitter;
an optical isolator disposed downstream the beam splitter; and
a second output beam collimation lens disposed downstream the optical isolator to direct the output beam to the output optical fiber.

12. A cavity mode locking method for an external cavity tunable laser including a semiconductor amplifier having a partial reflective end and an anti-reflective end, a cavity mirror provided at the anti-reflective end of the semiconductor amplifier to define an external cavity therebetween, a large-range phasing assembly and a quick phasing assembly (7) provided to adjust the optical length of the external cavity independently, the large-range phasing assembly comprising at least one temperature adjustable thermo-optic assembly having a silicon plate with light-passing surfaces and anti-reflective films provided on both light-passing surfaces, a heating resistor attached to a non-light region of one of the light-passing surfaces, and a temperature sensor attached to a non-light region of the other of the light-passing surfaces, the large-range phasing assembly further comprising a substrate having the cavity mirror and the quick phasing assembly disposed thereon, the temperature sensor being disposed on the substrate, and a semiconductor cooler disposed below the substrate an optical power detector to detect the optical power of the light output from the semiconductor amplifier, and a control unit in communication with the optical power detector, the large-range phasing assembly, and the quick phasing assembly, the control unit also in communication with the heating resistor and the temperature sensor to control the temperature of the silicon plate, the control unit also in communication with the temperature sensor and the semiconductor cooler and configured to adjust the optical length of the external cavity by controlling the temperature of the substrate, the method comprising:

- the control unit monitoring whether a difference between the output optical power value received from the optical power detector and a previous maximum output optical power value ($P1_{Max}$) in a cavity mode locking state is higher than a threshold;
- if yes, the control unit changing the driving input ($D_f$) of the quick phasing assembly to obtain a present maximum output optical power value ($P2_{Max}$);
- the control unit converting the driving input change ($D_f$-$CD_f$) of the quick phasing assembly to a driving input change ($\Delta D_L$) of the large-range phasing assembly; and
- the control unit adjusting the driving input of the large-range phasing assembly according to the converted driving input change and resetting the quick phasing assembly to the original driving input, so as to realize cavity mode locking.

13. The method of claim 12, further comprising:
- the control unit receiving an instruction to switch the optical channel wavelength of the laser; and
- in response to the instruction, the control unit adjusting the driving input of the large-range phasing assembly within a predetermined range to obtain a maximum optical output power.

14. The method of claim 13, wherein the large-range phasing assembly comprises a first large-range phasing assembly and a second large-range phasing assembly, the control unit adjusts the first large-range phasing assembly in response to the instruction to switch the optical channel wavelength of the laser and performs the converting and adjusting steps on the second large-range phasing assembly.

15. The method of claim 12, wherein converting the driving input change ($D_f$-$CD_f$) of the quick phasing assembly to a driving input change ($\Delta D_L$) of the large-range phasing assembly is performed according to the equation $\Delta D_L = K*(D_f - CD_f)$, $\Delta D_L$ represents the driving input change of the large-range phasing assembly, $D_f$ represents the driving input of the quick phasing assembly corresponding to the previous maximum output optical power value ($P1_{Max}$), $CD_f$ represents the driving input of the quick phasing assembly corresponding to the present maximum output optical power value ($P2_{Max}$), and K represents a linear scaling factor between the quick phasing assembly and the large-range phasing assembly.

16. The method of claim 15, wherein the linear scaling factor K is determined by the following steps:
- monitoring output frequency of the laser while changing the driving input of the quick phasing assembly to move the cavity mirror and change the optical length of the external cavity, thereby obtaining an equation $y_p = k_1 x_p + b_1$ representing a relationship between the driving input $x_p$ of the quick phasing assembly and the output frequency $y_p$ of the laser;
- monitoring output frequency of the laser while changing the driving input of the large-range phasing assembly to change the optical length of the external cavity, thereby obtaining an equation $y_b = k_2 x_b + b_2$ representing a relationship between the driving input $x_b$ of the large-range phasing assembly and the output frequency $y_b$ of the laser; and
- determine the linear scaling factor $K = k_1/k_2$.

17. The method of claim 12, wherein the large-range phasing assembly comprises a temperature adjustable thermo-optic assembly based on the thermo-optic effect and the driving input of the large-range phasing assembly is the temperature of the thermo-optic assembly, or a driving-voltage or driving-current adjustable electro-optic assembly based on the electro-optic effect and the driving voltage or current of the electro-optic assembly.

18. The method of claim 12, wherein the quick phasing assembly comprises a PZT element, and the driving input of the quick phasing assembly is the loading voltage of the PZT element.

\* \* \* \* \*